(12) United States Patent
Kanno et al.

(10) Patent No.: US 12,068,579 B2
(45) Date of Patent: Aug. 20, 2024

(54) SEMICONDUCTOR LASER

(71) Applicant: Nippon Telegraph and Telephone Corporation, Tokyo (JP)

(72) Inventors: Erina Kanno, Tokyo (JP); Koji Takeda, Tokyo (JP); Takaaki Kakitsuka, Tokyo (JP); Shinji Matsuo, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 297 days.

(21) Appl. No.: 17/311,759

(22) PCT Filed: Dec. 2, 2019

(86) PCT No.: PCT/JP2019/046964
§ 371 (c)(1),
(2) Date: Jun. 8, 2021

(87) PCT Pub. No.: WO2020/129585
PCT Pub. Date: Jun. 25, 2020

(65) Prior Publication Data
US 2022/0029385 A1   Jan. 27, 2022

(30) Foreign Application Priority Data
Dec. 17, 2018   (JP) ................. 2018-235209

(51) Int. Cl.
*H01S 5/125* (2006.01)
*H01S 5/0625* (2006.01)
*H01S 5/065* (2006.01)

(52) U.S. Cl.
CPC ............ *H01S 5/125* (2013.01); *H01S 5/0625* (2013.01); *H01S 5/0655* (2013.01)

(58) Field of Classification Search
CPC ...... H01S 5/125; H01S 5/0625; H01S 5/0655; H01S 5/2063; H01S 5/021; H01S 5/2222; H01S 5/2275; H01S 5/0424
See application file for complete search history.

(56) References Cited

U.S. PATENT DOCUMENTS

| 6,365,428 B1 * | 4/2002 | Zubrzycki | H01S 5/12 438/45 |
| 6,674,784 B2 * | 1/2004 | Takiguchi | H01S 5/22 372/98 |

(Continued)

FOREIGN PATENT DOCUMENTS

| CN | 108963754 A | * 12/2018 | ........... H01S 5/1231 |
| JP | 10056231 A | 2/1998 | |

(Continued)

OTHER PUBLICATIONS

Fujiwara et al. "Inherently Mode-Hop-Free Distributed Bragg Reflector (DBR) Laser Array," IEEE Journal of Selected Topics in Quantum Electronics,, vol. 9, No. 5, Sep./Oct. 2003, pp. 1132-1137.

(Continued)

*Primary Examiner* — Joshua King
(74) *Attorney, Agent, or Firm* — Slater Matsil, LLP

(57) ABSTRACT

A semiconductor laser includes an active region, a first distributed-Bragg-reflector region disposed contiguously with the active region, and a second distributed-Bragg-reflector region. The first distributed-Bragg-reflector region is formed contiguously with one side of the active region in a waveguide direction and includes a first diffraction grating. The second distributed-Bragg-reflector region is formed contiguously with to the other side of the active region in the waveguide direction and includes a second diffraction grating. The first diffraction grating includes recessed portions formed through a diffraction grating layer formed in the first distributed-Bragg-reflector region and convex portions adja- (Continued)

cent to the recessed portions. The diffraction grating layer is made of a dielectric material.

10 Claims, 14 Drawing Sheets

(56) References Cited

U.S. PATENT DOCUMENTS

| | | | | |
|---|---|---|---|---|
| 8,536,603 | B2* | 9/2013 | Illek | H01S 5/12 438/33 |
| 2004/0109485 | A1* | 6/2004 | Flory | H01S 5/1028 372/45.01 |
| 2008/0225918 | A1* | 9/2008 | Achtenhagen | H01S 5/12 372/44.01 |
| 2011/0235664 | A1* | 9/2011 | Illek | H01S 5/12 372/44.01 |
| 2012/0270347 | A1* | 10/2012 | Yagi | H01S 5/22 438/31 |
| 2015/0063753 | A1* | 3/2015 | Evans | H01S 5/12 438/31 |
| 2015/0093121 | A1 | 4/2015 | Matsuda et al. | |
| 2016/0315452 | A1* | 10/2016 | Chen | H01S 5/1032 |
| 2017/0104314 | A1 | 4/2017 | Park et al. | |
| 2021/0126430 | A1 | 4/2021 | Kanno et al. | |

FOREIGN PATENT DOCUMENTS

| | | | | |
|---|---|---|---|---|
| JP | 2015072980 A | | 4/2015 | |
| JP | 2017028231 A | * | 2/2017 | H01S 5/125 |
| JP | 2017073546 A | | 4/2017 | |
| JP | 2018006440 A | * | 1/2018 | |
| JP | 2018006440 A | | 1/2018 | |
| WO | WO-2018113501 A1 | * | 6/2018 | H01S 5/0425 |
| WO | 2019225331 A1 | | 11/2019 | |

OTHER PUBLICATIONS

Utaka et al., "$\lambda/4$-Shifted InGaAsP/InP DFB Lasers," IEEE Journal of Quantum Electronjcs, vol. QE-22, No. 7, Jul. 1986, pp. 1042-1051.

* cited by examiner

SEMICONDUCTOR LASER

CROSS-REFERENCE TO RELATED APPLICATIONS

This application is a national phase entry of PCT Application No. PCT/JP2019/046964, filed on Dec. 2, 2019, which claims priority to Japanese Application No. 2018-235209, filed on Dec. 17, 2018, which applications are hereby incorporated herein by reference.

TECHNICAL FIELD

The present invention relates to a semiconductor laser and more specifically relates to a semiconductor laser used for, for example, a light source for an optical transmitter.

BACKGROUND

At present, in response to the need for high-speed and high-capacity optical fiber communications by wavelength division multiplexing (WDM), various kinds of wavelength division multiplexing light sources have been developed. For the satisfaction of the need, the oscillation wavelength control of a laser acting as a light source is important. For example, related arts include a distributed feedback (DFB) laser (NPL 1).

A DFB laser includes diffraction gratings on an active layer. The oscillation wavelength of the laser is determined according to the pitches and depths of the diffraction gratings. Thus, the oscillation wavelength of the DFB laser is easily controlled. DFB lasers are frequently used as wavelength division multiplexing light sources.

Furthermore, such lasers acting as light sources include a distributed Bragg reflector (DBR) laser (NPL 2) that has diffraction gratings on an extension line of the waveguide of an active layer. The oscillation wavelength of a DBR laser is determined by a DBR stopband and a Fabry-Perot peak. A DBR laser has a phase control region provided by current injection, allowing a single-mode operation over a wide range. The oscillation wavelength of the DBR laser is adjusted over a wider range than that of a DFB laser.

CITATION LIST

Non Patent Literature

NPL 1 K. Utaka et al., "λ/4-Shifted InGaAsP/InP DFB Lasers", IEEE Journal of Quantum Electrons, Vol. QE-22, No. 7, pp. 1042, 1986.
NPL 2 N. Fujiwara et al., "Inherently Mode-Hop-Free Distributed Bragg Reflector (DBR) Laser Array", IEEE Journal of Selected Topics in Quantum Electronics, vol. 9, no. 5, pp. 1132-1137, 2003.

SUMMARY

Technical Problem

At present, WDM using semiconductor lasers as wavelength division multiplexing light sources has become more widely available, so that wavelength multiplexing with higher densities is needed. In response to such needs, oscillation wavelengths are to be more accurately controlled for increasing the density of wavelength multiplexing using the above-mentioned semiconductor lasers.

In the related art, however, it is not easy to accurately control oscillation wavelengths for the following reason: In the related art, asperities are ordinarily formed as diffraction gratings at predetermined intervals by etching a compound semiconductor such as InP, which constitutes a region for forming the diffraction gratings, by using a predetermined mask pattern. Thus, the control of the depth of a diffraction grating is determined by an etching amount.

However, as widely known, it is not easy to accurately control an etching amount, causing a manufacturing error. The oscillation wavelength of a DBR laser is determined by the coupling coefficient of a diffraction grating and the coupling coefficient of the diffraction grating depends upon the depth of the diffraction grating. Thus, the depth of the diffraction grating according to the etching amount may vary with a manufacturing error. This may cause incorrect control of the oscillation wavelength of the DBR laser, for example, a deviation of the oscillation wavelength of the DBR laser from a design value.

Embodiments of the present invention have been devised to solve the problem. An object of embodiments of the present invention is to accurately control the oscillation wavelength of a DBR laser.

Means for Solving the Problem

A semiconductor laser according to embodiments of the present invention includes: an active region including an active layer that is formed on a substrate and comprises a compound semiconductor; a first distributed-Bragg-reflector region that is formed contiguously with to one side of the active region in a waveguide direction and includes a first diffraction grating; and a second distributed-Bragg-reflector region that is formed contiguously with the other side of the active region in the waveguide direction and includes a second diffraction grating, wherein the first diffraction grating includes recessed portions formed through a diffraction grating layer formed in the first distributed-Bragg-reflector region and convex portions adjacent to the recessed portions, and the diffraction grating layer is made of a dielectric material.

According to a configuration example of the semiconductor laser, the first distributed-Bragg-reflector region includes a first core layer that is formed contiguously with the active layer and comprises a compound semiconductor, and the second distributed-Bragg-reflector region includes a second core layer that is formed contiguously with the active layer and comprises a compound semiconductor.

According to the configuration example of the semiconductor laser, the second diffraction grating includes recessed portions formed on a surface of the second core layer and convex portions adjacent to the recessed portions.

The configuration example of the semiconductor laser further includes a first upper clad layer formed on the first core layer; and a second upper clad layer formed on the second core layer.

According to the configuration example of the semiconductor laser, the second diffraction grating includes recessed portions formed on the top surface of the second core layer and convex portions adjacent to the recessed portions.

Effects of Embodiments of the Invention

As described above, according to embodiments of the present invention, the first diffraction grating of the first distributed-Bragg-reflector region includes the recessed portions formed through the diffraction grating layer comprising the dielectric material and the convex portions adjacent to the recessed portions, thereby accurately controlling the oscillation wavelength of a DBR laser.

DETAILED DESCRIPTION OF ILLUSTRATIVE EMBODIMENTS

Figure 1:
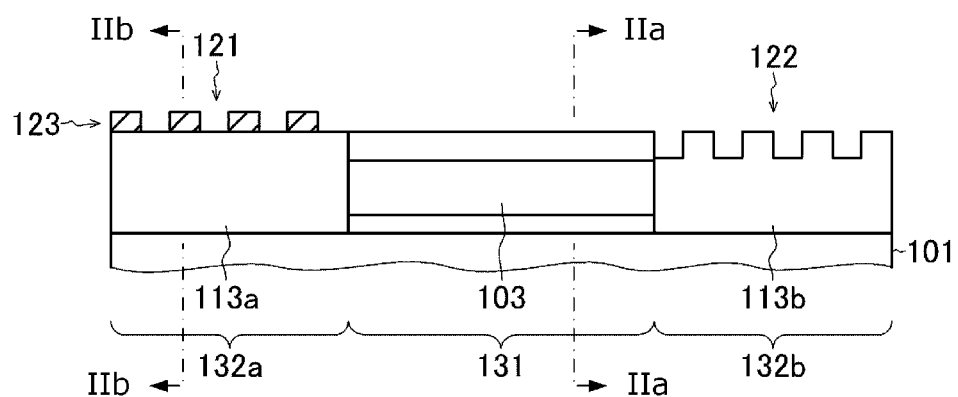
FIG. 1 is a cross-sectional view illustrating the configuration of a semiconductor laser according to embodiment 1 of the present invention.

Referring to FIG. 1, a semiconductor laser according to an embodiment of the present invention will be described below.

The semiconductor laser includes an active region 131, a first distributed-Bragg-reflector region 132a disposed contiguously with to the active region 131, and a second distributed-Bragg-reflector region 132b. The first distributed-Bragg-reflector region 132a is formed contiguously with one side of the active region 131 in a waveguide direction and includes a first diffraction grating 121. The second distributed-Bragg-reflector region 132b is formed contiguously with the other side of the active region 131 in the waveguide direction and has a second diffraction grating 122. The semiconductor laser is a so-called DBR laser.

The active region 131 includes an active layer 103 comprising a compound semiconductor. The first distributed-Bragg-reflector region 132a includes a first core layer 113a that is formed contiguously with the active layer 103 and comprises a compound semiconductor. The second distributed-Bragg-reflector region 132b includes a second core layer 113b that is formed contiguously with the active layer 103 and comprises a compound semiconductor.

The first diffraction grating 121 includes recessed portions formed through a diffraction grating layer 123 formed in the first distributed-Bragg-reflector region 132a and convex portions adjacent to the recessed portions. The diffraction grating layer 123 is made of a dielectric material, for example, SiN, $SiO_xN_y$, $SiO_2$, $Al_2O_3$, or $HfO_2$. In the embodiment, the second diffraction grating 122 includes recessed portions formed on a surface (top surface) of the second core layer 113b and convex portions adjacent to the recessed portions.

Figure 2A:
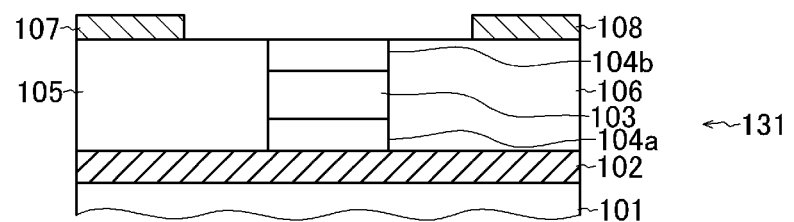
FIG. 2A is a cross-sectional view illustrating a partial configuration of the semiconductor laser according to the embodiment of the present invention.
Figure 2B:
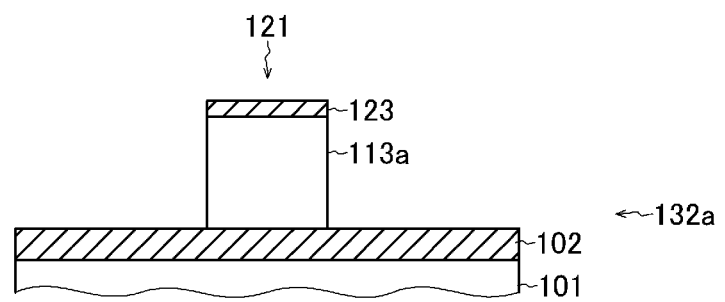
FIG. 2B is a cross-sectional view illustrating a partial configuration of the semiconductor laser according to the embodiment of the present invention.

Referring to FIGS. 2A and 2B, the semiconductor laser will be more specifically described below. FIGS. 2A and 2B illustrate the vertical sections of the semiconductor laser with respect to the waveguide direction. The active region 131, the first distributed-Bragg-reflector region 132a, and the second distributed-Bragg-reflector region 132b are formed on an identical substrate 101 with a lower clad layer 102 disposed therebetween. As illustrated in FIG. 2A, the active region 131 includes an n-type semiconductor layer 105 and a p-type semiconductor layer 106 that are in contact with the active layer 103. In this example, the n-type semiconductor layer 105 and the p-type semiconductor layer 106 are disposed in the planar direction of the substrate 101 with the active layer 103 disposed therebetween. The semiconductor layers are formed in contact with the sides of the active layer 103.

Moreover, the active region 131 includes an n-type electrode 107 electrically connected to the n-type semiconductor layer 105 and a p-type electrode 108 electrically connected to the p-type semiconductor layer 106. In the semiconductor laser of the embodiment, current is injected into the active layer 103 of the active region 131 in a direction parallel to the plane of the substrate 101 (lateral direction). The n-type electrode 107 may be formed on the n-type semiconductor layer 105 with an n-type contact layer disposed therebetween. In the n-type contact layer, an n-type impurity is introduced with a higher concentration. Likewise, the p-type electrode 108 may be formed on the p-type semiconductor layer 106 with a p-type contact layer disposed therebetween. In the p-type contact layer, a p-type impurity is introduced with a higher concentration. Alternatively, an n-type semiconductor layer and a p-type semiconductor layer may be disposed on and under the active layer in directions including but not limited to a direction parallel to the plane of the substrate and current may be injected in a vertical (longitudinal) direction with respect to the plane of the substrate.

The active layer 103 is vertically held by a semiconductor layer 104a and a semiconductor layer 104b when viewed from the substrate 101. The laminated structure of the semiconductor layer 104a, the active layer 103, and the semiconductor layer 104b is held by the n-type semiconductor layer 105 and the p-type semiconductor layer 106. The p-type semiconductor layer 106 and the n-type semiconductor layer 105 are formed so as to hold the active layer 103 in a direction parallel to the plane of the substrate 101.

In the embodiment, the active layer 103 is formed on the semiconductor layer 104a and the semiconductor layer 104b is formed on the active layer 103. Moreover, the n-type semiconductor layer 105 and the p-type semiconductor layer 106 are formed in contact with the sides of the laminated structure of the semiconductor layer 104a, the active layer 103, and the semiconductor layer 104b.

As illustrated in FIG. 2B, in the first distributed-Bragg-reflector region 132a, the n-type semiconductor layer 105 and the p-type semiconductor layer 106 are not formed and the sides of the first core layer 113a along the waveguide direction are open. The first core layer 113a of the first distributed-Bragg-reflector region 132a is shaped in a stripe form extending from the back to the front of FIG. 2B. The second core layer 113b is configured like the first core layer 113a. The n-type electrode 107 and the p-type electrode 108 are not formed in the first distributed-Bragg-reflector region 132a and the second distributed-Bragg-reflector region 132b.

The diffraction grating layer 123 is formed on the first core layer 113a and the first diffraction grating 121 is formed on the diffraction grating layer 123. As described above, the first diffraction grating 121 includes the recessed portions formed through the diffraction grating layer 123 and the convex portions adjacent to the recessed portions. The second diffraction grating 122 is formed on the top surface of the second core layer 113b. The semiconductor laser has a nonreflective film, which is not illustrated, on the output end face.

The substrate 101 is made of, for example, silicone. The lower clad layer 102 is made of, for example, silicon oxide (SiO) and is 2 µm in thickness. The active layer 103 has, for example, a quantum well structure with a thickness of 150 nm, in which InGaAsP well layers and barrier layers are alternately stacked. Moreover, the active layer 103 has a width of about 0.8 µm in cross section perpendicular to the waveguide direction. The total thickness of the semiconductor layer 104a, the active layer 103, and the semiconductor layer 104b is 250 nm. The n-type semiconductor layer 105 and the p-type semiconductor layer 106 are also 250 nm in thickness. The active layer 103 of the quantum well structure has an emission wavelength of 1.55 µm.

For example, the semiconductor layer 104a and the semiconductor layer 104b comprises undoped InP(i-InP). The active layer 103 is inserted between the n-type semiconductor layer 105 and the p-type semiconductor layer 106. The n-type semiconductor layer 105 comprises n-type InP(n-InP) doped with about $1\times10^{18}$ cm$^{-3}$ of Si and the p-type semiconductor layer 106 comprises p-type InP(p-InP) doped with about $1\times10^{18}$ cm$^{-3}$ of Zn. If an n-type contact layer and a p-type contact layer are used, these layers may comprise, for example, InGaAs.

The first core layer 113a and the second core layer 113b comprise undoped InP(i-InP) and have a width of about 1.5 µm and a thickness of 250 nm in cross section perpendicular to the waveguide direction. The diffraction grating layer 123 comprises SiN and the first diffraction grating 121 has a Bragg wavelength of 1.55 µm.

In the semiconductor laser, the lower clad layer 102 comprising silicon oxide with a low refractive index is formed under the InP layers having a high refractive index and air having a low refractive index is provided on the InP layers. This achieves excellent trapping of light in the active layer 103, the first core layer 113a, and the second core layer 113b, which is advantageous to low-power laser operations.

Referring to FIGS. 3A to 3E, a method of manufacturing the semiconductor laser according to the embodiment will be simply described below. FIGS. 3A to 3E are schematic diagrams illustrating the semiconductor laser being manufactured according to the embodiment. FIGS. 3A to 3E schematically illustrate the cross sections of the active region 131 in parallel to the waveguide direction.

For example, the substrate (silicon substrate) 101 including the lower clad layer 102 comprising silicon oxide is first prepared. The lower clad layer 102 is formed by, for example, thermally oxidizing the principal surface of the substrate 101.

A sacrificial layer comprising InGaAs, a compound semiconductor layer 203b serving as the semiconductor layer 104b, a compound semiconductor layer 204 serving as the active layer 103, and a compound semiconductor layer 203a serving as the semiconductor layer 104a, as well as compound semiconductor layers serving as the first core layer 113a and the second core layer 113b are epitaxially grown in sequence on an InP substrate, which is not illustrated. For example, the layers may be grown by well-known metal-organic chemical vapor deposition.

Figure 3A:
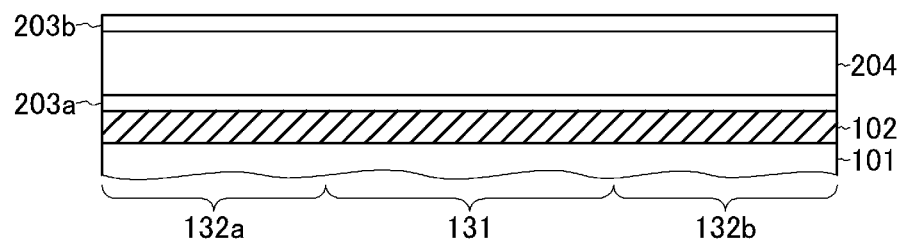
FIG. 3A is a cross-sectional view illustrating a state of the semiconductor laser being manufactured according to the embodiment of the present invention.

Subsequently, the top surface of the epitaxially grown substrate and the surface of the lower clad layer 102 of the substrate 101 are directly bonded to each other according to a publicly known wafer bonding technique, and then the InP substrate and the sacrificial layer are removed. Hence, as illustrated in FIG. 3A, over the active region 131, the first distributed-Bragg-reflector region 132a, and the second distributed-Bragg-reflector region 132b, the lower clad layer 102, the compound semiconductor layer 203a, the compound semiconductor layer 204, and the compound semiconductor layer 203b are formed on the substrate 101.

Figure 3B:
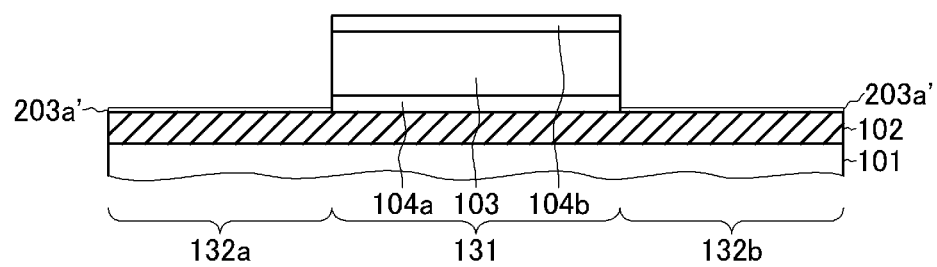
FIG. 3B is a cross-sectional view illustrating a state of the semiconductor laser being manufactured according to the embodiment of the present invention.

Subsequently, the compound semiconductor layer 203a, the compound semiconductor layer 204, and the compound semiconductor layer 203b are patterned by wet etching and dry etching with a resist pattern serving as a mask, the resist pattern being formed by a publicly known photolithography technique. Thus, as illustrated in FIG. 3B, the stripe structure of the active region 131 including the semiconductor layer 104a, the active layer 103, and the semiconductor layer 104b is formed. The active layer 103 is not left in the first distributed-Bragg-reflector region 132a and the second distributed-Bragg-reflector region 132b. In this configuration, the compound semiconductor layer 203a is not entirely removed by etching in the first distributed-Bragg-reflector region 132a and the second distributed-Bragg-reflector region 132b, leaving a thin compound semiconductor layer 203a'. After the formation of each pattern, the resist pattern is removed.

Figure 3C:
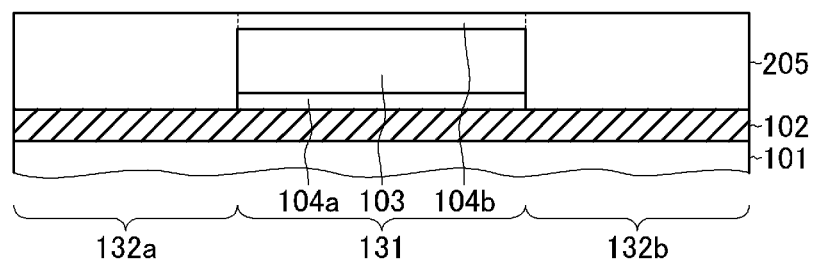
FIG. 3C is a cross-sectional view illustrating a state of the semiconductor laser being manufactured according to the embodiment of the present invention.

Subsequently, as illustrated in FIG. 3C, a compound semiconductor layer 205 comprising undoped InP is regrown from the remaining thin compound semiconductor layer 203a' so as to surround the formed semiconductor layer 104a, active layer 103, and semiconductor layer 104b. For example, a center growing mask comprising silicon oxide is formed on the semiconductor layer 104b. In this state, InP is epitaxially grown on the compound semiconductor layer 203a' in a selective manner, forming the compound semiconductor layer 205. Thus, in the first distributed-Bragg-reflector region 132a and the second distributed-Bragg-reflector region 132b, the compound semiconductor layer 205 is formed on the lower clad layer 102.

Subsequently, an n-type impurity and a p-type impurity are selectively introduced into regions on both sides of the active layer 103 in a direction perpendicular to the waveguide direction by, for example, ion implantation, so that the n-type semiconductor layer 105 and the p-type semiconductor layer 106 are formed in the active region 131. This forms the semiconductor layer 104b comprising undoped InP on the active layer 103. In this step, the compound semiconductor layer 205 is left in the first distributed-Bragg-reflector region 132a and the second distributed-Bragg-reflector region 132b with the active region 131 disposed between the regions.

Figure 3D:
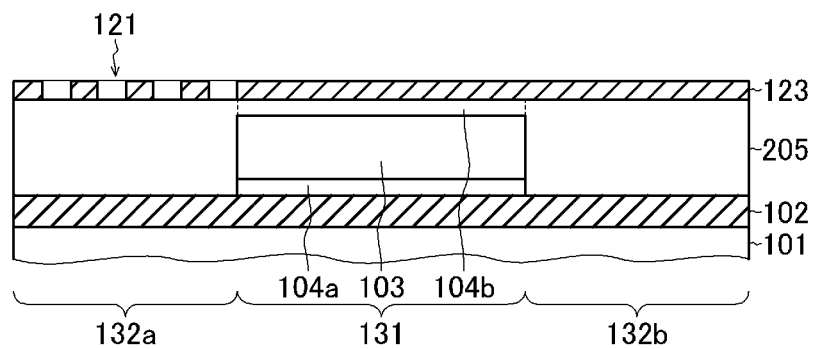
FIG. 3D is a cross-sectional view illustrating a state of the semiconductor laser being manufactured according to the embodiment of the present invention.

Subsequently, as illustrated in FIG. 3D, the diffraction grating layer 123 comprising SiN is formed on the semiconductor layer 104b and the compound semiconductor layer 205 and the first diffraction grating 121 is formed on the diffraction grating layer 123. For example, the diffraction grating layer 123 is formed by depositing SiN according to a well-known deposition method. The diffraction grating layer 123 is then patterned by a publicly known lithography technique and a publicly known etching technique so as to form the first diffraction grating 121. In this patterning, the recessed portions of the first diffraction grating 121 penetrate the diffraction grating layer 123.

Since the compound semiconductor layer 205 under the diffraction grating layer 123 comprises InP and the diffraction grating layer 123 comprises SiN, InP is hardly etched by the etching in the patterning of the diffraction grating layer 123, so that the compound semiconductor layer 205 acts as an etching stop layer. This eliminates the need for accurately controlling an etching amount in the formation of the recessed portions through the diffraction grating layer 123.

Figure 3E:
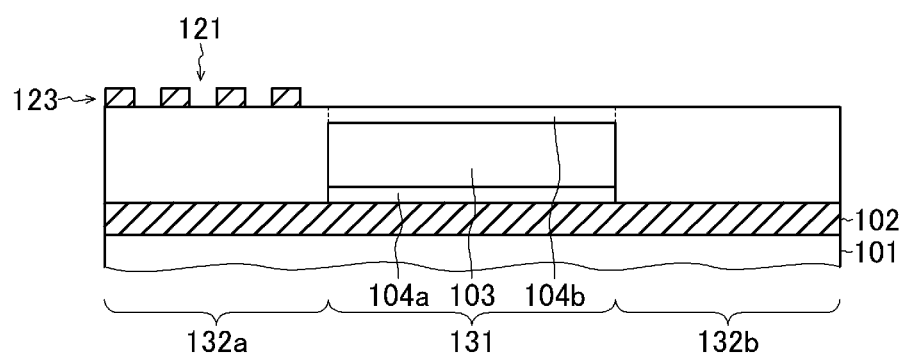
FIG. 3E is a cross-sectional view illustrating a state of the semiconductor laser being manufactured according to the embodiment of the present invention.

Subsequently, the mask pattern used for forming the first diffraction grating 121 is removed, and then the diffraction grating layer 123 is etched by using a mask pattern covering the first distributed-Bragg-reflector region 132a, so that the diffraction grating layer 123 is formed only in the first distributed-Bragg-reflector region 132a as illustrated in FIG. 3E. FIG. 3E illustrates a state after the mask pattern is removed.

Thereafter, as illustrated in FIG. 1, the second diffraction grating 122 is formed in the second distributed-Bragg-reflector region 132b. For example, the second diffraction grating 122 can be formed by patterning the compound semiconductor layer 205 in the second distributed-Bragg-reflector region 132b according to predetermined etching in which a resist pattern formed by a well-known lithography technique is used as a mask. In this step, the first core layer 113a and the second core layer 113b are not formed.

Subsequently, the compound semiconductor layer 205 is similarly patterned in the regions in the waveguide direction with the active region 131 disposed between the regions, so that the first core layer 113a is formed in a portion where the first diffraction grating 121 is formed and the second core layer 113b is formed in a portion where the second diffraction grating 122 is formed. With this configuration, the first core layer 113a and the second core layer 113b of the first distributed-Bragg-reflector region 132a and the second distributed-Bragg-reflector region 132b are formed by the compound semiconductor layer 205 used for forming the n-type semiconductor layer 105 and the p-type semiconductor layer 106 that are provided for current injection, achieving a simple process. Thereafter, the n-type electrode 107 is formed on the n-type semiconductor layer 105 and the p-type electrode 108 is formed on the p-type semiconductor layer 106.

Figure 4A:
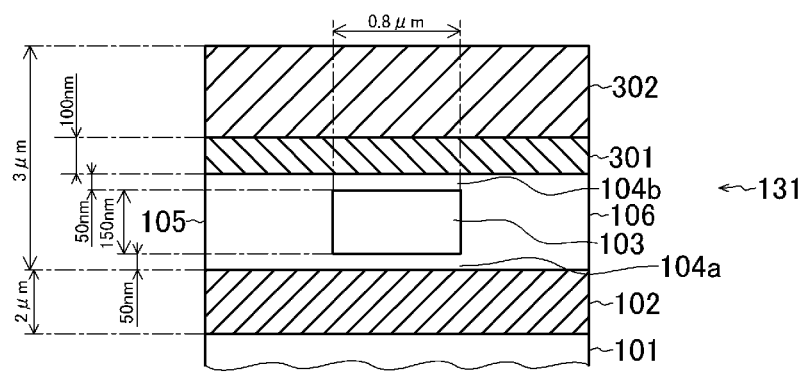
FIG. 4A is a cross-sectional view illustrating a partial configuration of another semiconductor laser according to the embodiment of the present invention.
Figure 4B:
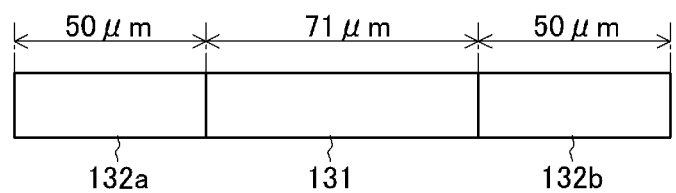
FIG. 4B is a block diagram illustrating a partial configuration of another semiconductor laser according to the embodiment of the present invention.

For example, if the active layer 103 has a quantum well structure in which nine quantum well layers comprising InGaAsP are stacked with a thickness of 150 nm as illustrated in FIG. 4A, the first distributed-Bragg-reflector region 132a having a guided wavelength of 50 μm is provided on one side of the active region 131 having a guided wavelength of 71 μm and the second distributed-Bragg-reflector region 132b having a guided wavelength of 50 μm is provided on the other side of the active region 131 as illustrate in FIG. 4B. Thus, this configuration can act as a semiconductor laser.

Figure 4C:
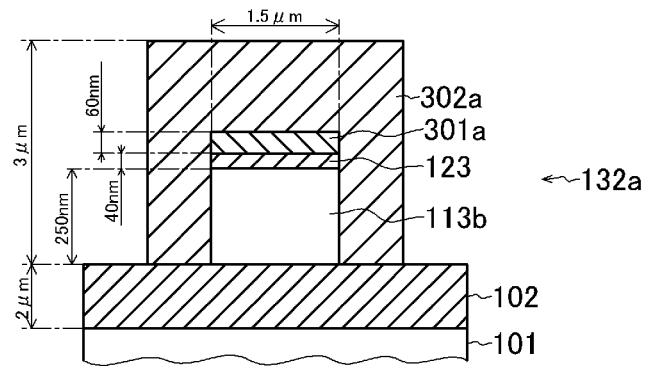
FIG. 4C is a cross-sectional view illustrating a partial configuration of another semiconductor laser according to the embodiment of the present invention.
Figure 4D:
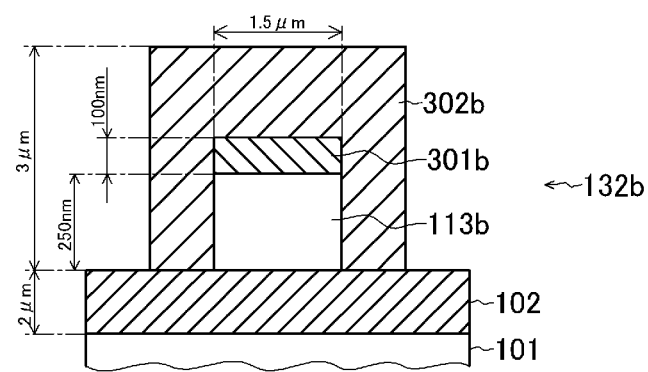
FIG. 4D is a cross-sectional view illustrating a partial configuration of another semiconductor laser according to the embodiment of the present invention.

As illustrated in FIGS. 4C and 4D, the first distributed-Bragg-reflector region 132a and the second distributed-Bragg-reflector region 132b include a spot-size conversion core 302a and a spot-size conversion core 302b that comprise SiOx with a larger amount of silicon than in stoichiometry. The spot-size conversion core 302a is formed on the diffraction grating layer 123 with a $SiO_2$ layer 301a disposed therebetween. The spot-size conversion core 302b is formed on the second core layer 113b with a SiO2 layer 301b disposed therebetween.

Furthermore, the active region 131 includes a SiO2 layer 301 formed contiguously with the SiO2 layer 301a and the SiO2 layer 301b and a SiOx layer 302 disposed on the SiO2 layer 301 so as to be formed contiguously with the spot-size conversion core 302a and the spot-size conversion core 302b. The dimensions are shown in FIGS. 4A, 4C, and 4D.

The first diffraction grating 121 is formed on the diffraction grating layer 123 having a thickness of 40 nm (the coupling coefficient is 147 cm-1). In the second distributed-Bragg-reflector region 132b, the recessed portions having a depth of 55 nm are formed on the top surface of the second core layer 113b comprising InP, thereby forming the second diffraction grating 122 (the coupling coefficient is 1860 cm-1). With this configuration, the lasing threshold gain of the semiconductor laser according to the embodiment is 61 cm-1, enabling laser oscillation.

According to the embodiment, an oscillation wavelength error caused by a manufacturing error of the diffraction grating can be suppressed. In a DBR laser including a diffraction grating, an oscillation wavelength is determined by the coupling coefficient of the diffraction grating. Thus, if the depth of the diffraction grating deviates from a design value, the oscillation wavelength deviates from a design value. For example, in the semiconductor laser illustrated in FIGS. 4A, 4B, 4C, and 4D, an error of the depth of the diffraction grating in the first distributed-Bragg-reflector region 132a may deviate a Bragg wavelength and thus designed oscillation cannot be obtained.

Figure 5:
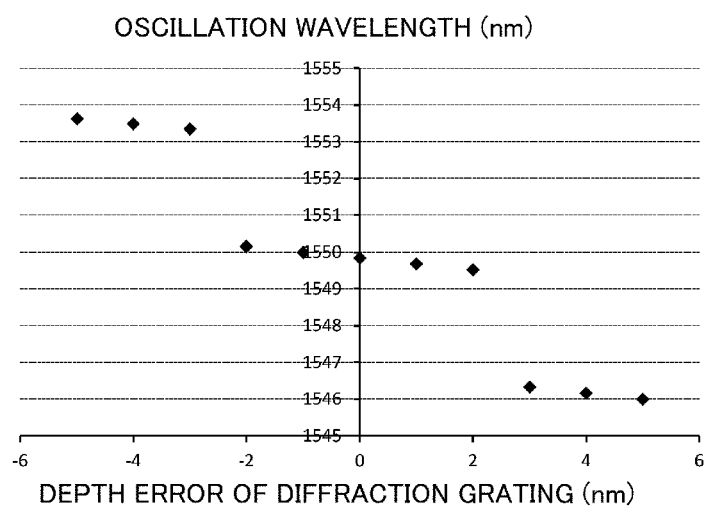
FIG. 5 is a characteristic diagram indicating the relationship between a depth error of a diffraction grating and an error of an oscillation wavelength.

For example, as indicated in FIG. 5, if a deviation (manufacturing error) of the depth of the diffraction grating from the design value reaches 3 nm or more, the oscillation wavelength deviates from a design value of 1550 nm. Hence, the control of the depth of the diffraction grating is important for controlling an oscillation wavelength. However, if the diffraction grating is formed by etching the first core layer 113a comprising a compound semiconductor, an etching amount is not easily controlled, so that the depth of the diffraction grating is not easily controlled.

In contrast to this configuration, according to the embodiment, the diffraction grating layer 123 is formed on the first core layer 113a and the recessed portions penetrating the diffraction grating layer 123 constitute the first diffraction grating 121, so that the depth of the diffraction grating is determined by the thickness of the diffraction grating layer 123. Generally, in the film formation of oxides such as SiN, a thickness can be easily controlled with higher accuracy than in the control of an etching amount. For example, by using the well-known ECR sputtering method, the thickness of the diffraction grating layer 123 can be controlled on the order of 1 nm.

Thus, the thickness of the diffraction grating layer 123 can be accurately equal to the design value of the depth of the diffraction grating and the first diffraction grating 121 having a depth determined by the thickness of the diffraction grating layer 123 can be accurately formed as deep as the design value of the depth of the diffraction grating. The first diffraction grating 121 is made of a dielectric material and thus has a smaller coupling coefficient than the second diffraction grating 122 comprising a semiconductor, causing a narrow stopband. Thus, the oscillation wavelength of the DBR laser (semiconductor laser) according to the embodiment is determined by the Bragg wavelength of the first diffraction grating 121 of the first distributed-Bragg-reflector region 132a. Hence, the embodiment can reduce a deviation from the design value of an oscillation wavelength, the deviation being caused by a manufacturing error of the first diffraction grating 121 for determining the oscillation wavelength, so that the oscillation wavelength of the DBR laser can be accurately controlled.

As described above, if the diffraction grating comprises a dielectric material, the coupling coefficient cannot be considerably increased, leading to lower reflectivity. Thus, if the diffraction grating comprises a dielectric material in the two distributed-Bragg-reflector regions, it is necessary to increase a reflector length in order to reduce the threshold gain of the DBR laser. To address the problem, in the embodiment, the second diffraction grating 122 comprising a semiconductor in the second distributed-Bragg-reflector region 132b increases reflectivity, thereby reducing the threshold gain of the laser with a short reflector length.

Figure 6:
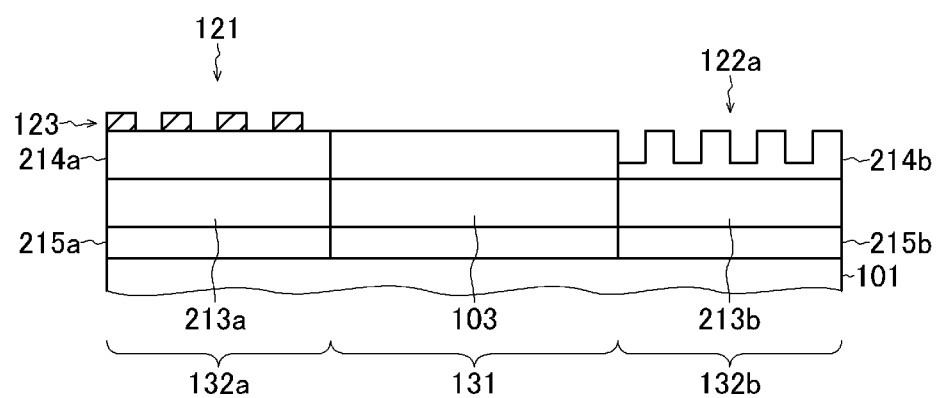
FIG. 6 is a plan view illustrating the configuration of another semiconductor laser according to the embodiment of the present invention.

As illustrated in FIG. 6, a core layer 213a and a core layer 213b that comprise InGaAsP can be formed in the first distributed-Bragg-reflector region 132a and the second distributed-Bragg-reflector region 132b, respectively, so as to obtain a butt-joint embedded waveguide. On the core layer 213a and the core layer 213b, a first upper clad layer 214a and a second upper clad layer 214b that comprise InP or the like are provided. The diffraction grating layer 123 is disposed on the first upper clad layer 214a. On the top surface of the second upper clad layer 214b, a second diffraction grating 122a is formed. The second diffraction grating 122a includes recessed portions formed on the top surface of the second upper clad layer 214b and convex portions adjacent to the recessed portions. Under the core layer 213a and the core layer 213b, a first lower clad layer 215a and a second lower clad layer 215b that comprise InP or the like are provided.

With this configuration, the active region 131, the first distributed-Bragg-reflector region 132a, and the second distributed-Bragg-reflector region 132b have the same equivalent refractive index, achieving the effect of suppressing a waveguide loss caused by reflection between the regions.

As described above, according to embodiments of the present invention, the first diffraction grating of the first distributed-Bragg-reflector region includes the recessed portions formed through the diffraction grating layer comprising the dielectric material and the convex portions adjacent to the recessed portions, thereby accurately controlling the oscillation wavelength of the DBR laser.

The present invention is not limited to the foregoing embodiment. It is obvious that various modifications and combinations can be made by a person with an ordinary skill in the art within the technical idea of the present invention.

REFERENCE SIGNS LIST

101 Substrate
102 Lower clad layer
103 Active layer
104a Semiconductor layer
104b Semiconductor layer
105 N-type semiconductor layer
106 P-type semiconductor layer
107 N-type electrode
108 P-type electrode
113a First core layer
113b Second core layer
121 First diffraction grating
122 Second diffraction grating
123 Diffraction grating layer
131 Active region
132a First distributed-Bragg-reflector region
132b Second distributed-Bragg-reflector region

The invention claimed is:

1. A semiconductor laser comprising:
an active region including an active layer on a substrate, the active layer comprising a compound semiconductor material;
a first distributed-Bragg-reflector region contiguous with a first side of the active region in a waveguide direction, the first distributed-Bragg-reflector region having a first diffraction grating; and
a second distributed-Bragg-reflector region contiguous with a second side of the active region in the waveguide direction, the second distributed-Bragg-reflector region having a second diffraction grating, wherein the first diffraction grating comprises a diffraction grating layer that is made of a dielectric material and formed in the first distributed-Bragg-reflector region, and the first diffraction grating includes first recessed portions extending through the diffraction grating layer;
wherein the first distributed-Bragg-reflector region further includes a first core layer that is contiguous with the active layer and comprises a compound semiconductor,
wherein the first core layer has a planar surface,
wherein the diffraction grating layer is disposed on the planar surface of the first core layer, and
wherein the diffraction grating layer is directly in contact with the planar surface of the first core layer.

2. The semiconductor laser according to claim 1, wherein:
the second distributed-Bragg-reflector region includes a second core layer that is contiguous with the active layer and comprises a compound semiconductor.

3. The semiconductor laser according to claim 2, wherein:
the second diffraction grating includes second recessed portions on a surface of the second core layer.

4. The semiconductor laser according to claim 2, further comprising:
a first upper clad layer formed on the first core layer; and
a second upper clad layer formed on the second core layer.

5. The semiconductor laser according to claim 4, wherein:
the second diffraction grating includes second recessed portions on a top surface of the second upper clad layer.

6. A method of forming a semiconductor laser, the method comprising:
providing an active region including an active layer on a substrate, the active layer comprising a compound semiconductor material;
forming a first distributed-Bragg-reflector region contiguous with a first side of the active region in a waveguide direction, the first distributed-Bragg-reflector region having a first diffraction grating; and
forming a second distributed-Bragg-reflector region contiguous with a second side of the active region in the waveguide direction, the second distributed-Bragg-reflector region having a second diffraction grating, wherein the first diffraction grating comprises a diffraction grating layer that is made of a dielectric material and formed in the first distributed-Bragg-reflector region; and patterning first recesses extending through the diffraction grating layer, wherein the first distributed-Bragg-reflector region further includes a first core layer that is contiguous with the active layer and comprises a compound semiconductor, wherein the first core layer has a planar surface, wherein the diffraction grating layer is disposed on the planar surface of the first core layer, and wherein the diffraction grating layer is directly in contact with the planar surface of the first core layer.

7. The method of claim 6, wherein:
the second distributed-Bragg-reflector region includes a second core layer that is contiguous with the active layer and comprises a compound semiconductor.

8. The method according to claim 7, further comprising:
patterning second recesses on a surface of the second core layer.

9. The method according to claim 7, further comprising:
forming a first upper clad layer formed on the first core layer; and
forming a second upper clad layer formed on the second core layer.

10. The method according to claim 9, further comprising:
patterning second recessed portions on a top surface of the second upper clad layer.

* * * * *